(12) United States Patent
Sekimoto

(10) Patent No.: US 8,570,763 B2
(45) Date of Patent: Oct. 29, 2013

(54) METHOD OF FORMING HOLE FOR INTERLAYER CONNECTION CONDUCTOR, METHOD OF PRODUCING RESIN SUBSTRATE AND COMPONENT-INCORPORATED SUBSTRATE, AND RESIN SUBSTRATE AND COMPONENT-INCORPORATED SUBSTRATE

(75) Inventor: Yasuyuki Sekimoto, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 187 days.

(21) Appl. No.: 12/647,566

(22) Filed: Dec. 28, 2009

(65) Prior Publication Data

US 2010/0101836 A1 Apr. 29, 2010

Related U.S. Application Data

(63) Continuation of application No. PCT/JP2008/059107, filed on May 19, 2008.

(30) Foreign Application Priority Data

Jul. 6, 2007 (JP) ................................ 2007-178437

(51) Int. Cl.
*H05K 7/00* (2006.01)
*H05K 1/09* (2006.01)
*H05K 1/11* (2006.01)
*H05K 7/10* (2006.01)

(52) U.S. Cl.
USPC ........... 361/779; 174/256; 174/257; 174/261; 361/760; 361/767; 361/771

(58) Field of Classification Search
USPC .......... 174/257, 261, 256; 361/761–766, 771, 361/779, 760, 767
See application file for complete search history.

(56) References Cited

U.S. PATENT DOCUMENTS

| 6,173,887 | B1 * | 1/2001 | Mead et al. | 228/248.1 |
| 6,534,723 | B1 * | 3/2003 | Asai et al. | 174/255 |
| 6,975,516 | B2 * | 12/2005 | Asahi et al. | 361/761 |
| 2005/0001331 | A1 * | 1/2005 | Kojima et al. | 257/778 |
| 2006/0021791 | A1 * | 2/2006 | Sunohara et al. | 174/255 |

(Continued)

FOREIGN PATENT DOCUMENTS

| JP | 06-314884 A | 11/1994 |
| JP | 2002-271039 A | 9/2002 |

(Continued)

OTHER PUBLICATIONS

Machine Translation of JP 2003188538 A: Multilayer Board and Multilayer Module; Jul. 2003.*

(Continued)

*Primary Examiner* — Timothy Thompson
*Assistant Examiner* — Sherman Ng
(74) *Attorney, Agent, or Firm* — Keating & Bennett, LLP

(57) ABSTRACT

A high quality component-incorporated substrate achieves a sufficient connection between an in-plane electrode and an interlayer connection conductor at low cost. A method of forming a hole for an interlayer connection conductor of a resin substrate includes a step of forming an in-plane electrode in a core substrate, a step of forming a light reflective conductor for reflecting a laser beam applied on the in-plane electrode in a later step, a step of forming a resin layer so as to cover the core substrate, the in-plane electrode and the light reflective conductor, and a step of forming a hole for the interlayer connection conductor by removing the resin layer on the light reflective conductor through the use of a laser beam.

6 Claims, 6 Drawing Sheets

(56) References Cited

U.S. PATENT DOCUMENTS

| | | | |
|---|---|---|---|
| 2006/0104855 A1* | 5/2006 | Rothschild | 420/560 |
| 2006/0246695 A1* | 11/2006 | Kim et al. | 438/584 |
| 2007/0086174 A1* | 4/2007 | Minamio et al. | 361/761 |
| 2007/0119541 A1* | 5/2007 | Kawabata et al. | 156/307.7 |

FOREIGN PATENT DOCUMENTS

| | | | |
|---|---|---|---|
| JP | 2002271039 A | * | 9/2002 |
| JP | 2003-188538 A | | 7/2003 |
| JP | 2003188538 A | * | 7/2003 |
| JP | 2003-243839 A | | 8/2003 |
| JP | 2006-108163 A | | 4/2006 |

OTHER PUBLICATIONS

Machine Translation of JP 2002271039 A: Multilayer Board and Its Machining Method; Sep. 2002.*

Official Communication issued in International Patent Application No. PCT/JP2008/059107, mailed on Jun. 24, 2008.

* cited by examiner

METHOD OF FORMING HOLE FOR INTERLAYER CONNECTION CONDUCTOR, METHOD OF PRODUCING RESIN SUBSTRATE AND COMPONENT-INCORPORATED SUBSTRATE, AND RESIN SUBSTRATE AND COMPONENT-INCORPORATED SUBSTRATE

BACKGROUND OF THE INVENTION

1. Field of the Invention

The present invention relates to a method of forming a hole for an interlayer connection conductor, a method of producing a resin substrate and a component-incorporated substrate, and a resin substrate and a component-incorporated substrate.

2. Description of the Related Art

A component-incorporated substrate in which a mount component is embedded inside a resin layer is lightweight and does not require burning at a high temperature as is the case with a ceramic multi-layer substrate, such that there are very few restrictions on the mount component to be incorporated therein. Therefore, such a component-incorporated substrate can be used in a wide variety of applications in the future. However, ways to improve the quality and to reduce the cost thereof are problematic.

FIG. 7C illustrates a conventional component-incorporated substrate 40. In FIG. 7C, the component-incorporated substrate 40 includes a core substrate 41 having a top surface with an in-plane electrode 42 provided therein, a mount component 44 mounted on the in-plane electrode 42 with a bonding material 43, and a resin layer 45 arranged to cover the top surface of the core substrate 41 and the mount component 44. An interlayer connection conductor 48 is arranged in the resin layer 45 to electrically connect the in-plane electrode 42 to external.

FIGS. 7A, 7B and 7C illustrate a method of producing the conventional component-incorporated substrate 40. FIG. 7A shows a state before the formation of a hole for an interlayer connection conductor, and FIG. 7B shows a state after the formation of a hole for an interlayer connection conductor 47 in the resin layer 45. The hole for the interlayer connection conductor 47 is formed by removing the resin layer 45 on the in-plane electrode 42 by laser machining. By filling the hole for the interlayer connection conductor 47 with a conductive paste, the interlayer connection conductor 48 shown in FIG. 7C is formed.

However, in the conventional production method as described above, a situation arises in that when the hole for the interlayer connection conductor 47 is formed by laser machining, the in-plane electrode 42 disposed beneath the hole for the interlayer connection conductor 47 is also removed. This is related to the surface roughness of the in-plane electrode 42. After removal of the resin layer 45 by laser machining, a laser beam reaches the surface of the in-plane electrode 42, wherein the in-plane electrode 42 is removed by the laser beam which is not reflected, if the surface roughness of the in-plane electrode 42 is relatively rough and the reflectivity of the laser beam is reduced accordingly. Even when the surface of the in-plane electrode 42 is relatively smooth, damage caused by the laser beam is likely to occur if the in-plane electrode 42 is relatively thin. When a portion of the in-plane electrode 42 is removed and damaged, the connection with the interlayer connection conductor 48 is insufficient, and a quality problem arises.

Machining with a laser having a reduced energy so that the laser beam will not damage the in-plane electrode 42 has been considered. However, when the laser energy is reduced, the machining time to remove the resin layer 45 is increased. This increases the cost, especially when a component-incorporated substrate having a large number of holes for the interlayer connection conductor 47 is produced.

Accordingly, a method of producing a component-incorporated substrate which ensures a sufficient connection between an in-plane electrode and an interlayer connection conductor at a reduced cost has been demanded.

Japanese Unexamined Patent Publication No. 6-314884 describes another example of the related art. Japanese Unexamined Patent Publication No. 6-314884 discloses a method of providing a hole for an interlayer connection conductor without performing laser removing machining by laminating a resin layer having a hole disposed therein so as to eliminate the aforementioned problem.

However, when this method is used to produce a component-incorporated substrate, resin flow corresponding to the volume of the mount component occurs during the lamination of the resin layer, such that the hole for the interlayer connection conductor is likely to deform. Therefore, the method disclosed in Japanese Unexamined Patent Publication No. 6-314884 is not suited for producing a component-incorporated substrate having a mount component incorporated therein.

SUMMARY OF THE INVENTION

To overcome the problems described above, preferred embodiments of the present invention provide a method of forming a hole for an interlayer connection conductor that is suitable for producing a component-incorporated substrate, a resin substrate and a component-incorporated substrate having high quality in which a sufficient connection between an in-plane electrode and an interlayer connection conductor is produced at a low cost, and a resin substrate and a component-incorporated substrate that is produced without deformation of the interlayer connection conductor.

According to a first preferred embodiment of the present invention, a method of forming a hole for an interlayer connection conductor includes the steps of preparing a base material including an in-plane electrode in a top surface, forming a light reflective conductor arranged to reflect a laser beam on the in-plane electrode, forming a resin layer on the base material so as to cover the in-plane electrode and the light reflective conductor, and forming the hole for the interlayer connection conductor by removing the resin layer on the light reflective conductor using a laser beam.

According to a second preferred embodiment of the present invention, a method of producing a resin substrate includes a first step of preparing a base material having an in-plane electrode in a top surface, a second step of forming a light reflective conductor arranged to reflect a laser beam on the in-plane electrode, a third step of forming a resin layer on the base material so as to cover the in-plane electrode and the light reflective conductor, a fourth step of forming a hole for an interlayer connection conductor by removing the resin layer on the light reflective conductor by a laser beam, and a fifth step of forming the interlayer connection conductor by covering or filling the hole for the interlayer connection conductor with a conductive material.

According to a third preferred embodiment of the present invention, a method of producing a component-incorporated substrate includes a first step of preparing a base material having an in-plane electrode in a top surface, a second step of forming a light reflective conductor arranged to reflect a laser beam on the in-plane electrode, a third step of forming a mounting conductor arranged to mount a mount component on the in-plane electrode, a fourth step of mounting the mount component on the in-plane electrode by the mounting conductor, a fifth step of forming a resin layer on the base material so as to cover the in-plane electrode, the light reflective conductor and the mount component, a sixth step of forming a hole for an interlayer connection conductor by removing a resin layer on the light reflective conductor using a laser beam, and a seventh step of forming the interlayer connection conductor by covering or filling the hole for the interlayer connection conductor with a conductive material.

The base material may preferably be a core substrate formed of a ceramic material, a resin material or a composite material thereof, for example, or may preferably be a transfer sheet for peeling off from the resin layer afterward, for example. When such a transfer sheet is used, the in-plane electrode will be exposed in the bottom surface of the resin layer of the resin substrate or the component-incorporated substrate. The interlayer connection conductor, which is also called a via conductor or a through-hole conductor, penetrates the resin layer and electrically connects the in-plane electrode arranged on the side of the bottom surface of the resin layer and a conductive portion formed on the side of the top surface of the resin layer.

During machining a hole for an interlayer connection conductor on the resin layer using a laser beam, the in-plane electrode can be damaged by the laser beam when the surface of the in-plane electrode is rough or the thickness of the in-plane electrode is relatively small. In preferred embodiments of the present invention, since a light reflective conductor is formed on the in-plane electrode, a laser beam is reflected at the light reflective conductor, and damage to the in-plane electrode is effectively prevented. When a hole for an interlayer connection conductor is machined using a laser beam having a relatively large output, the light reflective conductor can be partially damaged. However, even in this case, damage to the in-plane electrode can be effectively prevented. Accordingly, an acceptable output range of the laser beam is increased. After machining a hole for an interlayer connection conductor, the hole is covered with or filled with a conductive material to form an interlayer connection conductor. At this time, the light reflective conductor functions to electrically connect the conductive material and the in-plane electrode, so that electrical reliability is improved.

Prior to the step of forming the light reflective conductor, a step of roughening the surface of the in-plane electrode may be performed. For the roughening step, a method of performing roughening after forming a pattern of the in-plane electrode on a base material, or a method of forming an electrode layer on a base material, roughening the entire electrode layer, and then forming an in-plane electrode by etching can be used, for example. The roughening step is preferably performed before the formation of a light reflective conductor. By roughening the surface of the in-plane electrode, adherence with the resin layer is improved.

It is preferable that the light reflective conductor has a smooth surface facing an irradiation direction of the laser beam. In this case, the term "smooth" means that the surface is smooth enough such that the reflectivity of the laser beam is high, but is not necessarily entirely flat. This preferably corresponds to Ra=about 0.8 μm or less, for example, in terms of surface roughness. More preferably, it is a mirror finished surface (Ra=about 0.4 μm or less, for example).

The light reflective conductor can be formed by applying a solder paste (e.g., cream solder) on an in-plane conductor and melting it by heating. The surface of the solder paste, when applied, is not smooth because it includes solder particles and flux. However, when it is heated by reflow or other suitable method, the flux disappears and the solder particles melt to form a single block, and the surface becomes smooth enough to reflect a laser beam. As a method of melting the solder paste by heating, a dryer or other suitable method may be used instead of the reflow.

In production of a component-incorporated substrate, it is preferable to conduct a second step of forming a light reflective conductor on the in-plane electrode, a third step of forming a mounting conductor for mounting a mount component on the in-plane electrode, and a fourth step of mounting a mount component on the in-plane electrode using the mounting conductor in the following manner. A mount component is mounted simultaneously with the formation of a light reflective conductor by applying a solder paste simultaneously in a region in which a light reflective conductor is to be formed (hereinafter, referred to as "light reflective conductor forming region") and in a region in which a mounting conductor is to be formed (herein after referred to as "mounting conductor forming region") on the in-plane electrode, and placing a mount component on the solder paste applied in the mounting conductor forming region, and simultaneously melting the solder pastes in the light reflective conductor forming region and in the mounting conductor forming region by heating. As a method of applying a solder paste, a known printing method may preferably be used, for example, and as a method of melting the solder paste by heating, a known reflow treatment may preferably be used, for example. In this case, since the formation of the light reflective conductor and the mounting of the mount component on the in-plane electrode (formation of a mounting conductor) can be simultaneously performed using the solder paste, there is no need to increase the number of production steps, and even a component-incorporated substrate having a large number of interlayer connection conductors can be produced at a low cost.

According to various preferred embodiments of the present invention, a high quality component-incorporated substrate in which sufficient connection between an in-plane electrode and an interlayer connection conductor is ensured can be produced at a low cost. In addition, a component-incorporated substrate can be produced without deformation of the interlayer connection conductor.

Other elements, features, steps, characteristics and advantages of the present invention will become more apparent from the following detailed description of the preferred embodiments with reference to the attached drawings.

DETAILED DESCRIPTION OF PREFERRED EMBODIMENTS

Hereinafter, preferred embodiments of the present invention will be illustrated with reference to drawings.

First Preferred Embodiment

Figure 1:
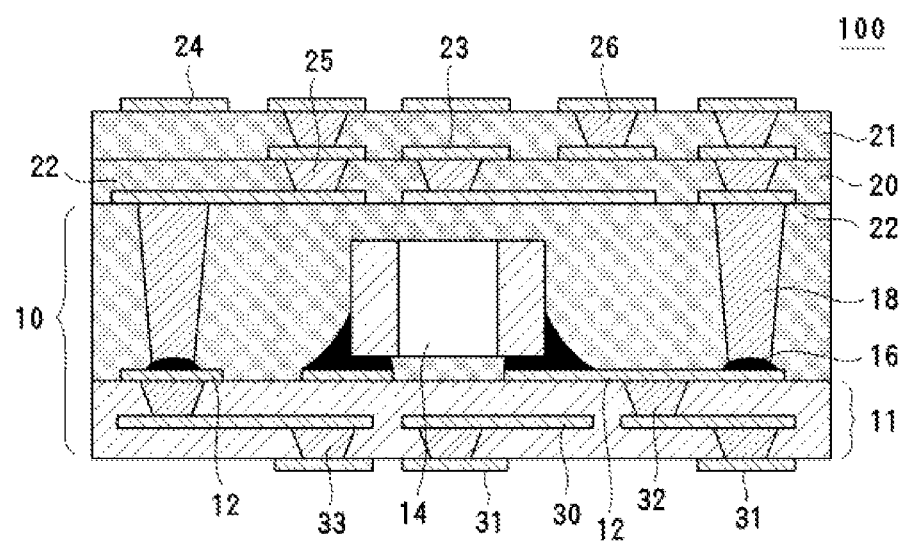
FIG. 1 is a longitudinal section of a component-incorporated module related to preferred embodiments of the present invention.

FIG. 1 is a longitudinal section of a component-incorporated module 100 formed by laminating a ceramic layer and a resin layer. In a component-incorporated substrate 10 which is a portion of the component-incorporated module 100, a mount component 14, such as a chip capacitor, for example, is mounted on a core substrate 11, and the top surface of the core substrate is provided with a resin layer 15 that covers the mount component 14. The top surface of the core substrate 11 includes an in-plane electrode 12, and the resin layer 15 includes an interlayer connection conductor (via conductor or through-hole conductor) 18. On the top surface of the component-incorporated substrate 10, other resin layers 20, 21 are laminated while in-plane electrodes 22, 23, 24 are interposed therebetween, and the in-plane electrode 12 is connected with the in-plane electrode 22 on the top surface of the resin layer 15 via the interlayer connection conductor 18. The in-plane electrodes 22, 23, 24 are mutually connected via the interlayer connection conductors 25, 26.

The core substrate 11 of this preferred embodiment is preferably a multi-layer substrate made of a ceramic material, a resin material or a mixed material thereof, for example. As shown in FIG. 1, on front and back surfaces and inside the core substrate 11, in-plane electrodes 12, 30, 31 are formed, and these in-plane electrodes are mutually connected via interlayer connection conductors 32, 33. The core substrate 11 may have any suitable structure, and may preferably be a substrate of single layer structure, for example.

Figure 2A:
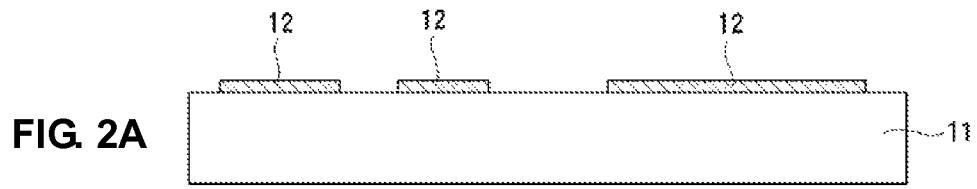
FIGS. 2A to 2D are views illustrating the first half of a production method of a component-incorporated substrate according to a first preferred embodiment of the present invention.

FIGS. 2A to 2D and FIGS. 3A to 3C illustrate a method of producing the component-incorporated substrate 10. First, as shown in FIG. 2A, the core substrate 11 formed with the in-plane electrode 12 is prepared. In a specific region on the core substrate 11, the in-plane electrode 12 is formed. The in-plane electrode 12 is preferably formed of a material such as Cu, Ag, Au, Ag—Pt, or Ag—Pd, for example, and is preferably formed by a photolithographic method or a screen printing method, for example. When the core substrate 11 is a ceramic substrate, the in-plane electrode 12 may be sintered metal obtained by integrally firing a conductive paste with the ceramic substrate.

Figure 2B:
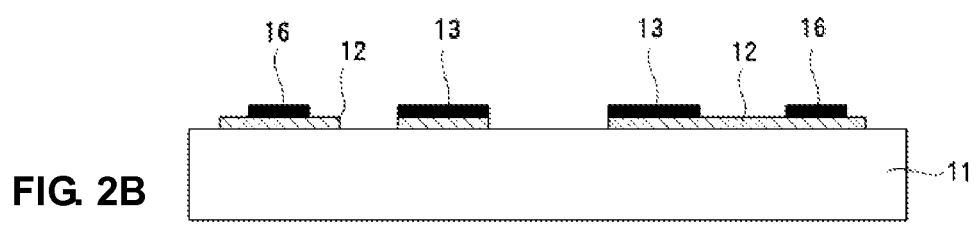

FIG. 2B is a view showing a state in which a mounting conductor 13 and a light reflective conductor 16 are formed on the in-plane electrode 12. The material for the mounting conductor 13 and the light reflective conductor 16 is preferably formed by applying a cream solder made of Sn—Ag, Sn—Bi, for example, and is applied on the in-plane electrode 12 by a screen printing method or a dispensing method, for example.

The region in which the mounting conductor 13 is formed by applying a region on the in-plane electrode 12 corresponding to the mount component 14 to be mounted in a later step. The region in which the light reflective conductor 16 is formed by applying a region on the in-plane electrode 12 corresponding to the interlayer connection conductor 18 to be formed in a later step, and is a region different from that of the mounting conductor 13.

The mounting conductor 13 and the light reflective conductor 16 are efficiently formed because they can be formed together in the step shown in FIG. 2B. For example, in a screen printing method, the mounting conductor 13 and the light reflective conductor 16 can preferably be formed simultaneously with one printing mask. In the case of a dispensing method, each electrode can be formed in a short time by a series of operations merely by applying a cream solder sequentially. Therefore, the fabrication cost is not significantly increased due to the formation of the light reflective conductor 16.

Figure 2C:
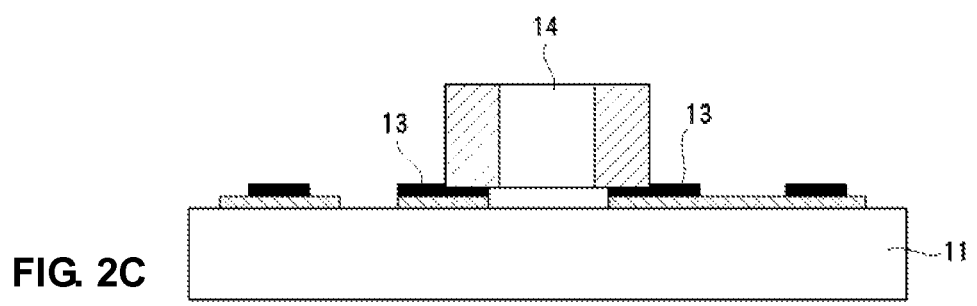

FIG. 2C is a view showing a state in which the mount component 14 is arranged on the mounting conductor 13. The mount component 14 is positioned by an automated mounting machine, for example, and is temporarily fixed by a cream solder, for example. As an example of the mount component 14, surface mount components such as chip capacitor, chip resistor and chip inductor can use used.

Figure 2D:
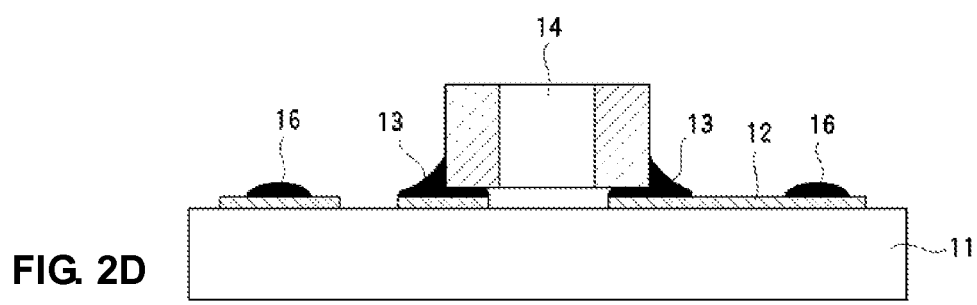

FIG. 2D is a view after subjecting an intermediate product fabricated by the steps of FIG. 2A to FIG. 2C to a heat treatment. The heat treatment temperature is preferably about 240° C., for example, and a reflow, dryer and other suitable method may be used. As a result of the heat treatment, the cream solder melts, and the mount component 14 is securely fixed to the in-plane electrode 12 and surface of the light reflective conductor 16 is smoothed.

Here, a process in which surface of an electrode is smoothed will be described. The surface of the light reflective conductor 16 formed in FIG. 2B has not been smoothed yet at this point of time. This is because the cream solder is prepared only by mixing solder particles and flux, and an electrode formed by applying this cream solder has surface irregularities due to the solder particles. As a result of the heat treatment by a reflow, for example, the solder particles melt to become one block and the surface irregularities disappear. Through the above-described process, the surface of the electrode is smoothed.

The reason for smoothing surface of the electrode is to ensure that the laser beam is reflected during laser machining performed in a later step. Therefore, the term "smooth" means that the surface is smooth enough to make the reflectivity of the laser beam relatively high, which preferably corresponds to a surface roughness, Ra=about 0.8 μm or less, for example. More preferably, the surface roughness is a mirror finished surface, Ra=about 0.4 μm or less, for example.

The light reflective conductor 16 having a smooth surface formed in this manner defines a connecting conductor arranged to electrically connect the in-plane electrode 12 and the interlayer connection conductor 18 that is formed in a later step.

Figure 3A:
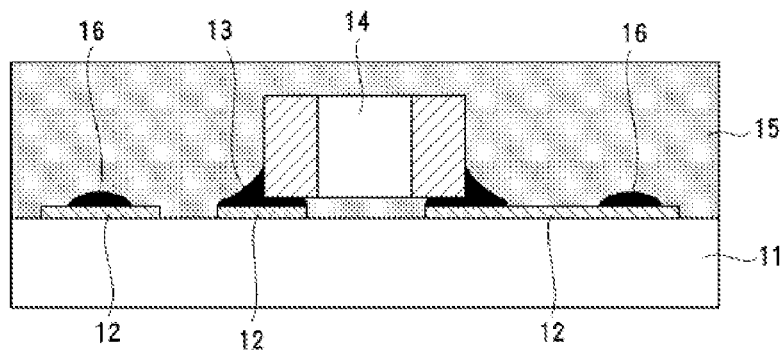
FIGS. 3A to 3C are views illustrating the second half of the production method of a component-incorporated substrate according to the first preferred embodiment of the present invention.

FIG. 3A is a view of a resin multi-layer substrate fabricated by forming the resin layer 15 on the intermediate product produced in the step of FIG. 2D. The resin layer 15 is formed by pressing a resin layer in a semi-hardened state on a top layer portion of the core substrate 11 so as to cover the core substrate 11, the in-plane electrode 12, the mounting conductor 13, the mount component 14, and the light reflective conductor 16.

The resin layer 15 in a semi-hardened state preferably includes a thermosetting resin and an inorganic filler, for example. As the thermosetting resin, for example, epoxy resin, phenol resin, or cyanate resin is preferably used, and as the inorganic filler, silica powder, or alumina powder, for example, is preferably used.

As a method of sealing the resin layer 15 in a semi-hardened state by pressing, a vacuum press is preferably used. With this method, it is possible to prevent air bubbles from occurring inside the resin layer. In addition, it is preferable to perform the pressing along with heating. This makes it possible to harden the thermosetting resin in a semi-hardened state and to provide a favorable bonding condition between the resin layer 15, the core substrate 11, and each electrode. In the manner described above, a resin multi-layer substrate in which the resin layer 15 is laminated on the core substrate 11 is produced.

Figure 3B:
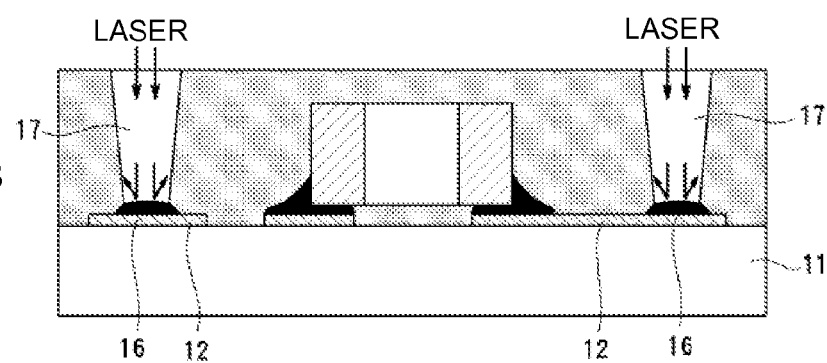

FIG. 3B is a view in which the hole for an interlayer connection conductor 17 is formed by laser machining the resin layer 15 on the light reflective conductor 16. A $CO_2$ laser having high absorptance with respect to resin is preferably used. In this preferred embodiment of the present invention, a laser beam is reflected by the light reflective conductor 16 during the formation of the hole for the interlayer connection conductor, so that the electrode 12 of the lower layer including the light reflective conductor 16 is not damaged.

Immediately after removing the resin layer 15 by laser machining, the laser beam reaches the light reflective conductor 16. In this preferred embodiment of the present invention, since surface of the light reflective conductor 16 produced in the steps shown in FIGS. 2A to 2D is smooth, the reflectivity of the laser beam is relatively large. Therefore, heat absorption of the light reflective conductor 16 is relatively small, and the laser will not remove and damage the light reflective conductor 16. In a conventional method, the in-plane electrode 12 or the core substrate 11 beneath the in-plane electrode 12 is also removed, and a crack may be produced. However, by providing the light reflective conductor 16 having a smooth surface as shown in this preferred embodiment of the present invention, such a defect no longer occurs and quality can be improved. This effect is particularly pronounced when a ceramic substrate is used as the core substrate 11, and the in-plane electrode 12 is a sintered metal that is fired simultaneously with the ceramic substrate. This is because sintered metal has poor surface smoothness, and does not sufficiently reflect a laser beam, so that the laser beam penetrates the in-plane electrode 12 and damages the core substrate 11.

In addition, since the reflectivity of the laser beam can be increased with the light reflective conductor 16 having a smooth surface, the hole for the interlayer connection conductor can be machined by a laser having a large energy without penetration through the electrode 12. Since it is possible to set the laser energy greater than that in a conventional method, machining time for forming the hole can be reduced.

Further, since the thickness of the electrode is substantially increased by providing the light reflective conductor 16, the heat capacity of the electrode is increased, a temperature rise due to laser machining is suppressed, and damage to the electrode is effectively prevented.

In the present preferred embodiment of the present invention, since the hole for the interlayer connection conductor 17 is machined after forming the resin layer 15, deformation of the hole for the interlayer connection conductor 17 is less than in the conventional method. A conventional method includes providing a hole for an interlayer connection conductor by bonding a resin layer having a through-hole therein to the core substrate. However, in this method, the hole for the interlayer connection conductor will deform by compression when pressing the resin layer. In the component-incorporated substrate, in particular, it is necessary to displace resin by an amount corresponding to the volume of the mount component at the time of laminating the resin layer, so that the resin flow is large and deformation of the interlayer connection conductor is significant. In the present preferred embodiment of the present invention, since machining of the hole for the interlayer connection conductor 17 is performed after the formation of the resin layer 15, such a problem does not occur.

Prior to forming the interlayer connection conductor 18 in the next step, it is preferable to perform a desmear treatment on the hole for the interlayer connection conductor 17. At this time, while a resin portion of the lateral surface of the hole for the interlayer connection conductor 17 is roughened, the light reflective conductor 16 on the lower surface of the hole for the interlayer connection conductor 17 is not roughened and smoothness is maintained.

Figure 3C:
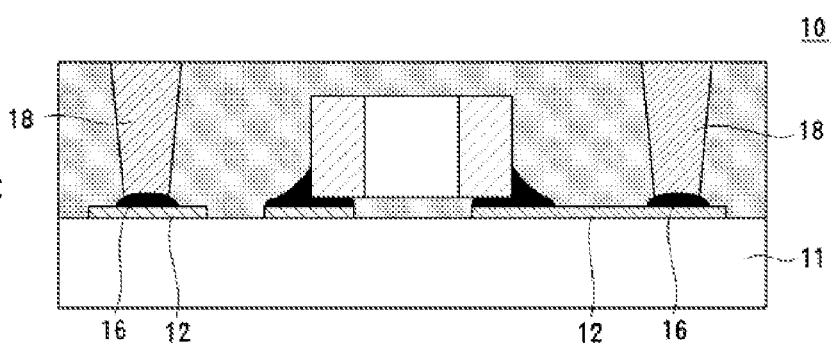

FIG. 3C is a view in which the interlayer connection conductor 18 is formed by filling the hole for the interlayer connection conductor 17 with a conductor. As a method of forming the interlayer connection conductor 18, not only filling with the conductor, but also a method of covering the hole for the interlayer connection conductor 17 with a conductor is used. Preferably, a method of plating the interior of the hole for the interlayer connection conductor 17, or a method of filling the interior of the hole for the interlayer connection conductor 17 with a conductive paste containing thermosetting resin can preferably be used. With the steps shown in FIGS. 2A to 2D and FIGS. 3A to 3C, the component-incorporated substrate 10 is produced.

For fabricating the component-incorporated module 100 shown in FIG. 1 using the component-incorporated substrate 10 as described above, after forming the in-plane electrode 22 to be connected with the interlayer connection conductor 18 on the top surface of the resin layer 15, the resin layers 20, 21 may be laminated thereon, and the in-plane electrodes 23, 24 and the interlayer connection conductors 25, 26 may be formed. As the resin layers 20, 21, not only those not including a component, but also those including a component as is the case with the resin layer 15 are applicable.

Second Preferred Embodiment

Figure 4:
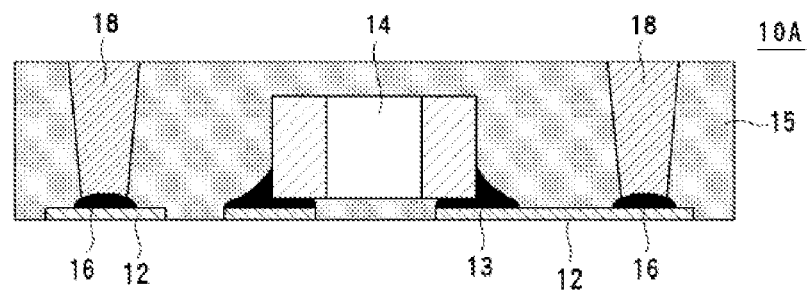
FIG. 4 is a cross section view of a component-incorporated substrate according to a second preferred embodiment of the present invention.

FIG. 4 shows another component-incorporated substrate 10A. This component-incorporated substrate 10A is produced using a transfer sheet instead of the core substrate 11, and transferring the in-plane electrode 12 to the resin layer 15 by peeling off the transfer sheet from the resin layer 15 after forming the resin layer 15 through the steps of FIGS. 2A to 2D and FIGS. 3A to 3C. As the transfer sheet, a metal sheet of stainless steel or other suitable material may be used, or a resin sheet, such as a carrier film, may be used. A metal foil may be pasted on the transfer sheet, and patterned to form an in-plane electrode. In this case, the component-incorporated substrate 10A is preferably made only of the resin layer 15, and the in-plane electrode 12 is exposed on the bottom surface of the resin layer 15.

Third Preferred Embodiment

Figure 5A:
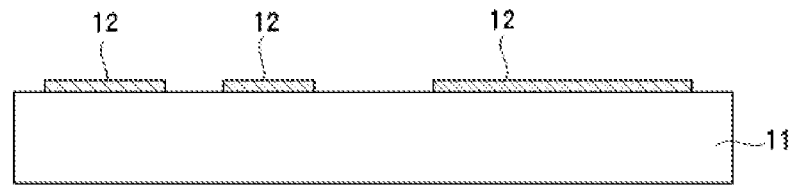
FIGS. 5A and 5B are views showing a method of forming an in-plane electrode according to a third preferred embodiment of the present invention.
Figure 5B:
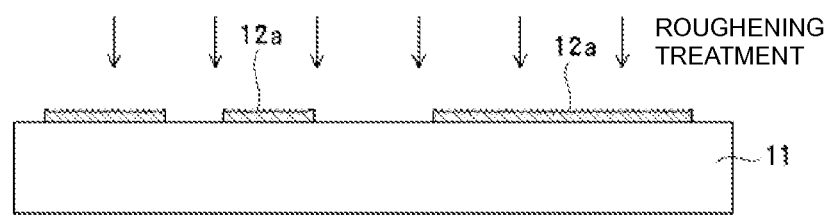

FIGS. 5A and 5B are views illustrating a method of roughening surface of the in-plane electrode 12. This roughening treatment is performed prior to the formation of the light reflective conductor 16 in the first preferred embodiment. As shown in FIG. 5A, the patterned in-plane electrode 12 is formed on the core substrate 11, and then an in-plane electrode 12a is roughened as shown in FIG. 5B. The roughening treatment is performed as either a dry method or a wet method, and the surface roughness Ra after the treatment is preferably about 1 μm, for example.

Steps following the roughening treatment are substantially the same as those of the first preferred embodiment. That is, after preparing the in-plane electrode 12a that is roughened as shown in FIG. 5B, the step of forming the light reflective conductor 16 and the mounting conductor 13, the step of mounting the mount component 14, the step of forming the resin layer 15, the step of forming the hole for the interlayer connection conductor 17, and the step of forming the interlayer connection conductor 18 as described in the first preferred embodiment are performed.

By roughening the surface of the in-plane electrode 12a as in the present preferred embodiment, it is possible to increase the adherence power with the resin layer 15. However, if a light reflective conductor as in the present preferred embodiment is not provided and the roughening treatment is merely performed, the reflectivity of the laser beam on the in-plane electrode 12a is relatively small during the formation of the hole for the interlayer connection conductor in a later step, and the in-plane electrode 12a or the core substrate 11 provided in a forming position of the hole for the interlayer connection conductor 17 will be damaged.

By forming the light reflective conductor 16 on the roughened in-plane electrode 12a as is in preferred embodiments of the present invention and irradiating it with a laser beam, the reflectivity increases, and the laser beam will not reach the in-plane electrode 12a. That is, preferred embodiments of the present invention achieve the effect of increasing the adherence power between the in-plane electrode 12a and the resin layer 15, while achieving the effect of forming the hole for the interlayer connection conductor 17 without damaging the in-plane electrode 12a or the core substrate 11.

Fourth Preferred Embodiment

Figure 6A:
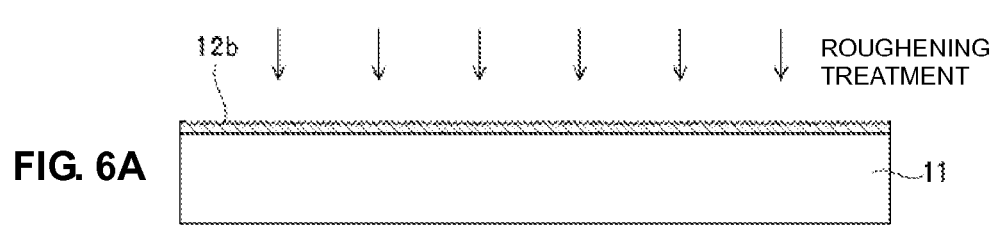
FIGS. 6A and 6B are views showing a method of forming an in-plane electrode according to a fourth preferred embodiment of the present invention.
Figure 6B:
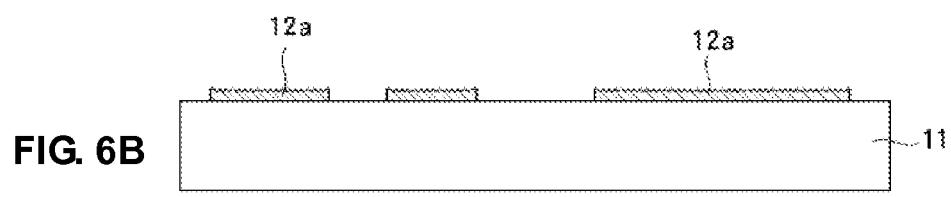
Figure 7A:
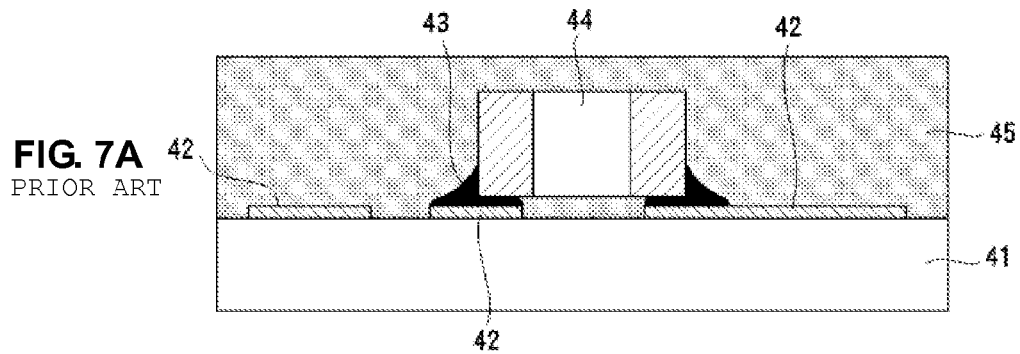
FIGS. 7A to 7C are views showing a method of producing a conventional component-incorporated substrate.
Figure 7B:
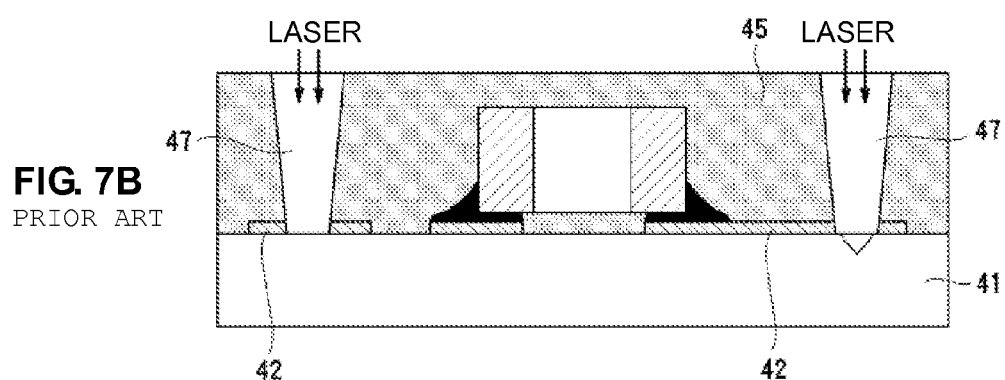
Figure 7C:
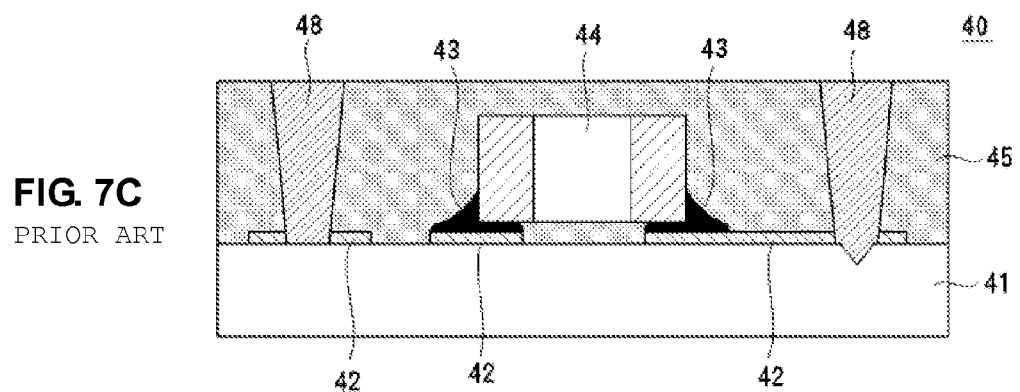

FIGS. 6A and 6B are views illustrating the pattern forming of the in-plane electrode 12a by etching after forming an electrode layer 12b that is not patterned on the core substrate 11 and roughening the entire electrode layer 12. The roughening treatment and the electrode formation are performed prior to the formation of the light reflective conductor 16 in the first preferred embodiment. The roughening treatment is performed using either a dry method or a wet method, and surface roughness Ra of the in-plane electrode 12a is preferably about 1 µm, for example.

The steps following the formation of the in-plane electrode 12a are substantially the same as those of the first preferred embodiment. That is, after preparing the in-plane electrode 12a that is roughened as shown in FIG. 6B, the step of forming the light reflective conductor 16 and the mounting conductor 13, the step of mounting the mount component 14, the step of laminating and sealing a resin material, the step of forming the hole for the interlayer connection conductor 17, and the step of forming the interlayer connection conductor 18 as described in the first preferred embodiment are performed.

EXAMPLE 1

An example of fabricating a component-incorporated substrate based on the first preferred embodiment will be described. First, as a core substrate, a substrate of a ceramic based dielectric material primarily made of glass (LTCC: Low Temperature Co-fired Ceramics) having an in-plane electrode in its top surface was prepared. The in-plane electrode is a sintered metal that is integrally fired with the core substrate after the application of a conductive paste primarily made of Cu on the core substrate. Surface roughness Ra of the in-plane electrode formed from sintered metal was about 1.38 µm, for example.

Next, a mounting conductor and a light reflective conductor were formed by applying a cream solder by screen printing on the in-plane electrode. A material of the cream solder was Cu—Ag—Sn (Pb-free solder), and applied film thickness was about 80 µm. Next, a chip capacitor (approximate size: about 0.6 mm×about 0.3 mm×about 0.3 mm) was mounted on the mounting conductor and temporarily fixed.

Thereafter, the core substrate mounting the chip capacitor (intermediate product) was place in a reflow furnace, and heated at about 240° C. As a result, the cream solder melted to solder the in-plane electrode and the mount component, and surface of the light reflective conductor was smoothed. At this time, the surface roughness of the light reflective conductor Ra was equal to or less than about 0.4 µm, for example.

Next, a resin layer having a thickness of about 400 µm made of a mixture of about 90% by weight of silica powder and about 10% of liquid epoxy resin was prepared, and pressed to the surface of the core substrate on the side at which the mount component is mounted, in a vacuum press. Thereafter, the epoxy resin included in the resin layer was allowed to set at about 170° C. for about an hour.

Next, a hole for an interlayer connection conductor was formed by laser machining. A CO2 laser having high absorptance with respect to epoxy resin was used. The hole for the interlayer connection conductor that was produced was about 200 µm in diameter, for example. The bottom of the hole for the interlayer connection conductor was checked to reveal that there was no damage in the light reflective conductor and the gloss was maintained.

Since the light reflective conductor enables intentional reflection of the laser beam, the laser energy could be increased to about twice to three times as compared to conventional cases. As a result, it was possible to reduce the laser machining time.

Next, the hole for the interlayer connection conductor was subjected to a desmear treatment, and then the hole for the interlayer connection conductor was filled with a conductive paste by a printing using a squeegee. As the conductive paste, Ag paste was used. In the manner described above, the component-incorporated substrate was fabricated.

EXAMPLE 2

An example of fabricating a component-incorporated substrate based on the second preferred embodiment will be described. In the second preferred embodiment, a surface of the in-plane electrode is subjected to a roughening treatment. This roughening treatment is performed prior to the formation of a light reflective conductor in the first preferred embodiment. Steps following the roughening treatment are substantially the same as those in Example 1 and description thereof will be omitted.

First, as a core substrate including an in-plane electrode, a substrate of a ceramic based dielectric material primarily made of glass (LTCC: Low Temperature Co-fired Ceramics) was prepared. The in-plane electrode is sintered metal primarily made of Cu.

The substrate was subjected to a roughening treatment by performing a chemical treatment by acid, for example. Surface roughness Ra after the treatment was about 1.3 µm, for example. In this manner, it is possible to make the surface roughness intentionally rough, and to improve the adherence power with the resin layer that is pressed later.

EXAMPLE 3

An example of fabricating a component-incorporated substrate based on the third preferred embodiment will be described. In the third preferred embodiment, after subjecting the entire electrode layer 12a formed on the core substrate 11 to a roughening treatment, the in-plane electrode 12 is formed by etching. The roughening treatment and the electrode formation are performed prior to the formation of a light reflective conductor of the first preferred embodiment. Steps following the formation of the in-plane electrode are substantially the same as those in Example 1 and description thereof will be omitted.

First, as a core substrate, a substrate made of a resin material (epoxy resin) was prepared. Next, a Cu foil was pressed by pressing to the core substrate, followed a chemical treatment by acid to roughen the entire Cu foil. Thereafter, a Cu in-plane electrode was formed by etching. At this time, the surface roughness Ra of the Cu in-plane electrode was about 1.0 μm, for example. In this manner, it is possible to make the surface roughness intentionally rough, and to improve the adherence power with the resin layer to be pressed later.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A resin substrate comprising:
a core substrate including an in-plane electrode in a top surface thereof;
a light reflective conductor having a smooth surface provided on the in-plane electrode, the smooth surface of the light reflective conductor having a curved convex shape;
a resin layer arranged on the core substrate so as to cover the in-plane electrode and the light reflective conductor; and
an interlayer connection conductor defined by a hole for an interlayer connection conductor that extends from a top surface of the resin layer to the light reflective conductor and that is covered or filled with a conductive material; wherein
the light reflective conductor is made of a cream solder that has been applied on the in-plane electrode, melted, and hardened; and
the light reflective conductor is provided on a portion of the in-plane electrode adjacent to or aligned with the hole in the resin layer but not on other portions of the in-plane electrode.

2. A resin substrate comprising:
a resin layer including an in-plane electrode in a bottom surface thereof;
a light reflective conductor provided on the in-plane electrode and having a smooth surface defined by a top surface covered with the resin layer, the smooth surface of the light reflective conductor having a curved convex shape; and
an interlayer connection conductor defined by a hole for an interlayer connection conductor that extends from a top surface of the resin layer to the light reflective conductor and that is covered or filled with a conductive material; wherein
the light reflective conductor is made of a cream solder that has been applied on the in-plane electrode, melted, and hardened; and
the light reflective conductor is provided on a portion of the in-plane electrode adjacent to or aligned with the hole in the resin layer but not on other portions of the in-plane electrode.

3. A component-incorporated substrate comprising:
a core substrate including an in-plane electrode in a top surface thereof;
a mount component mounted on the in-plane electrode via a mounting conductor;
a light reflective conductor provided in a region different from a mounting region of the mount component on the in-plane electrode, and having a smooth surface defined by a top surface, the smooth surface of the light reflective conductor having a curved convex shape;
a resin layer arranged on the core substrate so as to cover the mounting conductor, the mount component and the light reflective conductor; and
an interlayer connection conductor defined by a hole for an interlayer connection conductor that extends from a top surface of the resin layer to the light reflective conductor and that is covered or filled with a conductive material; wherein
the light reflective conductor is made of a cream solder that has been applied on the in-plane electrode, melted, and hardened; and
the light reflective conductor is provided on a portion of the in-plane electrode adjacent to or aligned with the hole in the resin layer but not on other portions of the in-plane electrode.

4. A component-incorporated substrate comprising:
a resin layer including an in-plane electrode in a bottom surface thereof;
a mount component mounted on the in-plane electrode via a mounting conductor, and including a periphery covered with the resin layer;
a light reflective conductor provided in a region different from a mounting region of the mount component on the in-plane electrode, and including a smooth surface defined by a top surface covered with the resin layer, the smooth surface of the light reflective conductor having a curved convex shape; and
an interlayer connection conductor extending from a top surface of the resin layer to the light reflective conductor; wherein
the light reflective conductor is made of a cream solder that has been applied on the in-plane electrode, melted, and hardened; and
the light reflective conductor is provided on a portion of the in-plane electrode adjacent to or aligned with the hole in the resin layer but not on other portions of the in-plane electrode.

5. The component-incorporated substrate according to claim 3, wherein the mounting conductor is also made of the cream solder that has been melted and hardened.

6. The component-incorporated substrate according to claim 4, wherein the mounting conductor is also made of the cream solder that has been melted and hardened.

* * * * *